United States Patent
Gottwald (10) Patent No.: US 10,340,446 B1
(45) Date of Patent: Jul. 2, 2019

(54) SEMICONDUCTOR STRUCTURE MULTILAYERS HAVING A DUSTING MATERIAL AT AN INTERFACE BETWEEN A NON-MAGNETIC LAYER AND A MAGNETIC LAYER

(71) Applicant: International Business Machines Corporation, Armonk, NY (US)

(72) Inventor: Matthias Georg Gottwald, New Rochelle, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/913,145

(22) Filed: Mar. 6, 2018

(51) Int. Cl.
| | | |
|---|---|---|
| G11C 11/16 | (2006.01) | |
| H01L 43/08 | (2006.01) | |
| H01L 27/22 | (2006.01) | |
| H01L 43/02 | (2006.01) | |
| H01L 43/10 | (2006.01) | |
| H01L 43/12 | (2006.01) | |
| G11C 11/15 | (2006.01) | |

(52) U.S. Cl.
CPC ............. *H01L 43/08* (2013.01); *G11C 11/15* (2013.01); *G11C 11/161* (2013.01); *H01L 27/222* (2013.01); *H01L 43/02* (2013.01); *H01L 43/10* (2013.01); *H01L 43/12* (2013.01)

(58) Field of Classification Search
CPC .............................. G11C 11/15; G11C 11/161
See application file for complete search history.

(56) References Cited

U.S. PATENT DOCUMENTS

| | | | |
|---|---|---|---|
| 6,818,961 B1 * | 11/2004 | Rizzo | ..................... B82Y 25/00 257/421 |
| 7,663,197 B2 | 2/2010 | Nagase et al. | |
| 8,508,006 B2 | 8/2013 | Jan et al. | |
| 8,852,760 B2 | 10/2014 | Wang et al. | |
| 9,252,710 B2 | 2/2016 | Wang et al. | |
| 9,472,752 B2 | 10/2016 | Wang et al. | |
| 9,484,531 B2 | 11/2016 | Hu et al. | |
| 9,647,204 B2 | 5/2017 | Hu et al. | |
| 2012/0241878 A1 | 9/2012 | Hu et al. | |
| 2014/0070341 A1 * | 3/2014 | Beach | ..................... H01L 29/82 257/421 |
| 2014/0306302 A1 * | 10/2014 | Jan | .......................... H01L 43/10 257/421 |
| 2015/0028440 A1 | 1/2015 | Liu et al. | |
| 2017/0294573 A1 | 10/2017 | Hu et al. | |
| 2018/0301266 A1 * | 10/2018 | Ou | ...................... G11C 11/1675 |

* cited by examiner

*Primary Examiner* — Huan Hoang
*Assistant Examiner* — Jay W. Radke
(74) *Attorney, Agent, or Firm* — Vazken Alexanian; Ryan, Mason & Lewis, LLP (57) ABSTRACT

A semiconductor structure includes a seed layer and a multilayer stack of one or more multilayers disposed over the seed layer, each of the one or more multilayers including a magnetic layer and an additional layer disposed over a top surface of the magnetic layer. The additional layer includes a non-magnetic material and a dusting material. The multilayer stack provides a reference layer of a perpendicular magnetic tunnel junction stack. The magnetic layer may be formed of cobalt, the non-magnetic material may be at least one of iridium and rhodium, and the dusting material may be at least one of platinum, ruthenium, palladium, gold and nickel.

20 Claims, 8 Drawing Sheets

SEMICONDUCTOR STRUCTURE MULTILAYERS HAVING A DUSTING MATERIAL AT AN INTERFACE BETWEEN A NON-MAGNETIC LAYER AND A MAGNETIC LAYER

BACKGROUND

The present application relates to semiconductors, and more specifically, to techniques for forming semiconductor structures. Magnetoresistive random access memory (MRAM) is a non-volatile computer memory (NVRAM) technology. In some conventional random access memory (RAM) devices, data is stored as electric charge or current flows. MRAM, in contrast, stores data using magnetic storage elements. Such elements may be formed using two ferromagnetic plates separated by a thin insulating later. Spin transfer torque MRAM (STT-MRAM) is a type of MRAM device in which the spin of electrons can be flipped using a spin-polarized current in a magnetic tunnel junction (MTJ).

SUMMARY

Embodiments of the invention provide techniques for forming multilayers with a dusting material at an interface between a non-magnetic layer and a magnetic layer. The dusting material may be formed as a dusting layer disposed between the non-magnetic layer and the magnetic layer, or may be incorporated into the non-magnetic layer so as to form a non-magnetic alloy layer. The multilayers may be used in forming a reference layer of a perpendicular magnetic tunnel junction stack.

In one embodiment, a method of forming a semiconductor structure comprises forming a multilayer stack of one or more multilayers disposed over a seed layer, each of the one or more multilayers comprising a magnetic layer and an additional layer disposed over a top surface of the magnetic layer. The additional layer comprises a non-magnetic material and a dusting material. The multilayer stack provides a reference layer of a perpendicular magnetic tunnel junction stack.

In another embodiment, a semiconductor structure comprises a seed layer and a multilayer stack of one or more multilayers disposed over the seed layer, each of the one or more multilayers comprising a magnetic layer and an additional layer disposed over a top surface of the magnetic layer. The additional layer comprises a non-magnetic material and a dusting material. The multilayer stack provides a reference layer of a perpendicular magnetic tunnel junction stack.

In another embodiment, an integrated circuit comprises a semiconductor structure comprising a seed layer and a multilayer stack of one or more multilayers disposed over the seed layer, each of the one or more multilayers comprising a magnetic layer and an additional layer disposed over a top surface of the magnetic layer. The additional layer comprises a non-magnetic material and a dusting material. The multilayer stack provides a reference layer of a perpendicular magnetic tunnel junction stack.

DETAILED DESCRIPTION

Illustrative embodiments of the invention may be described herein in the context of illustrative methods for forming reference layers in perpendicular magnetic tunnel junction stacks, along with illustrative apparatus, systems and devices having self-aligned contacts formed using such methods. However, it is to be understood that embodiments of the invention are not limited to the illustrative methods, apparatus, systems and devices but instead are more broadly applicable to other suitable methods, apparatus, systems and devices.

MRAM devices, as described above, may include a grid or other arrangement of multiple cells. Spin transfer torque MRAM (STT-MRAM), as mentioned above, is a type of MRAM device in which the spin of electrons can be flipped using a spin-polarized current in a magnetic tunnel junction (MTJ). STT-MRAM can provide a number of advantages, including reduced power consumption and cost. Particularly, STT-MRAM provides advantages in scaling permitting higher densities of MRAM cells at a lower cost. MTJs in MRAM devices generally comprise an insulating layer (e.g., the tunnel junction) formed between two or more ferromagnetic layers.

Figure 1:
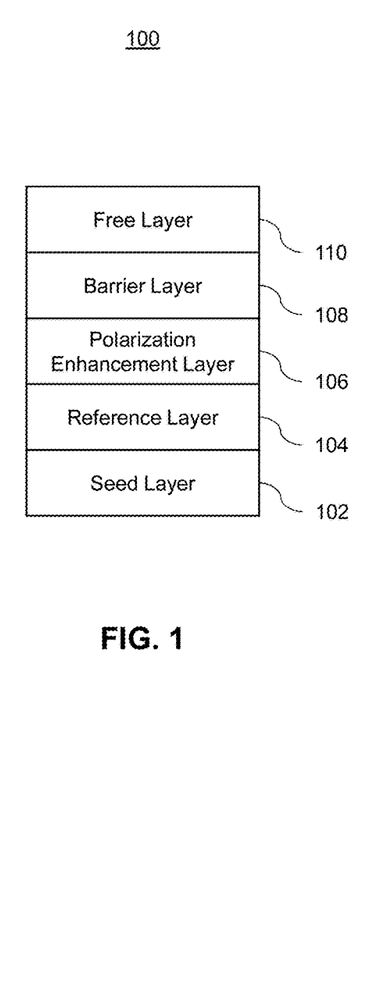
FIG. 1 depicts a side cross-sectional view of a perpendicular magnetic tunnel junction stack, according to an embodiment of the present invention.

FIG. 1 shows a cross-sectional view 100 of a perpendicular MTJ (pMTJ) stack for integration into a STT-MRAM device. The pMTJ stack includes a seed layer 102, a reference layer 104, a polarization enhancement layer (PEL) 106, a barrier layer 108 and a free layer 110.

The seed layer 102 may be formed of iridium (Ir), rhodium (Rh), or another suitable material such as alloys and multilayers of these elements. The seed layer 102 may have a vertical thickness in the range of 1 nm to 20 nm.

The reference layer 104 may be formed as a multilayer structure as will be described in further detail below with respect to FIGS. 2-16. The multilayer structure of reference layer 104 includes one or more magnetic layers, which may be cobalt (Co)-based, although other suitable magnetic materials such as a Co-rich cobalt-iron (Co—Fe) alloy (e.g., a Co—Fe alloy with more than 50% Co), a Co-rich cobalt-nickel (Co—Ni) alloy, a cobalt-boron (Co—B) alloy, etc. may be used in the reference layer 104. For example, the reference layer 104 may be a [Co|NM]$_{xN}$ multilayer, where NM denotes a non-magnetic layer such as Ir, Rh, etc. For a certain thickness of the NM layers in the [Co|NM]$_{xN}$ multilayer, there can be an antiparallel coupling between the Co layers separated by the NM layer.

Such [Co|NM]$_{xN}$ multilayers can have high perpendicular anisotropy, which is a necessary requirement in order to form a stable reference layer 104. However, the interface energies between the Co and the NM layers in the [Co|NM]$_{xN}$ multilayer may impact the Co growth mode, as will be described in further detail below with respect to FIGS. 2-6. As a consequence of interface energies, in some cases the deposition of Co on top of the NM layer may not result in a layer-by-layer kind of growth. Instead, a nucleation of Co islands may be formed on top of the NM layer. The Co islands may only start to form a continuous layer of Co for Co thicknesses of about 1 nm and above. Post-deposition anneals (e.g., complementary metal-oxide-semiconductor (CMOS) back end of line (BEOL) anneals in the case where the MTJ stack is used for embedded MRAM) may enhance the agglomeration of Co to islands on top of the NM layer. As a consequence, the [Co|NM]$_{xN}$ multilayer might exhibit significant roughness that is unfavorable in a reference layer 104 for a pMTJ stack. Further, non-continuous Co layers might lead to non-reliable reference layers 104 for scaled pMTJ devices.

The PEL 106 may be formed of a cobalt-iron-boron (Co—Fe—B) alloy, although other suitable materials such as Co—Fe—B with an iron (Fe) dusting layer, Co—Fe—B alloyed with one or more of tantalum (Ta), tungsten (W), molybdenum (Mo), niobium (Nb), vanadium (V) or zirconium (Zr), etc. may be used. The PEL 106 may have a vertical thickness in the range of 4 angstroms (Å) to 20 Å.

The barrier layer 108 may be formed of magnesium oxide (MgO), although other suitable materials such as aluminum oxide (AlO$_x$) or magnesium titanium oxide (MgTiO) may be used. The barrier layer 108 may have a vertical thickness in the range of 5 Å to 20 Å. The barrier may have a resistance area product (RA) in the range of 0.1-100 Ohm* micrometers squared (µm$^2$).

The free layer 110 may be formed of a Co—Fe—B alloy, with additions of, for example, MgO, Nb, W, Ta, Mo, V, Zr, or insertion layers of MgO, Nb, W, Ta, Mo, V, Zr, etc. The free layer 110 may have a vertical thickness in the range of 10 Å to 100 Å.

Figure 2:
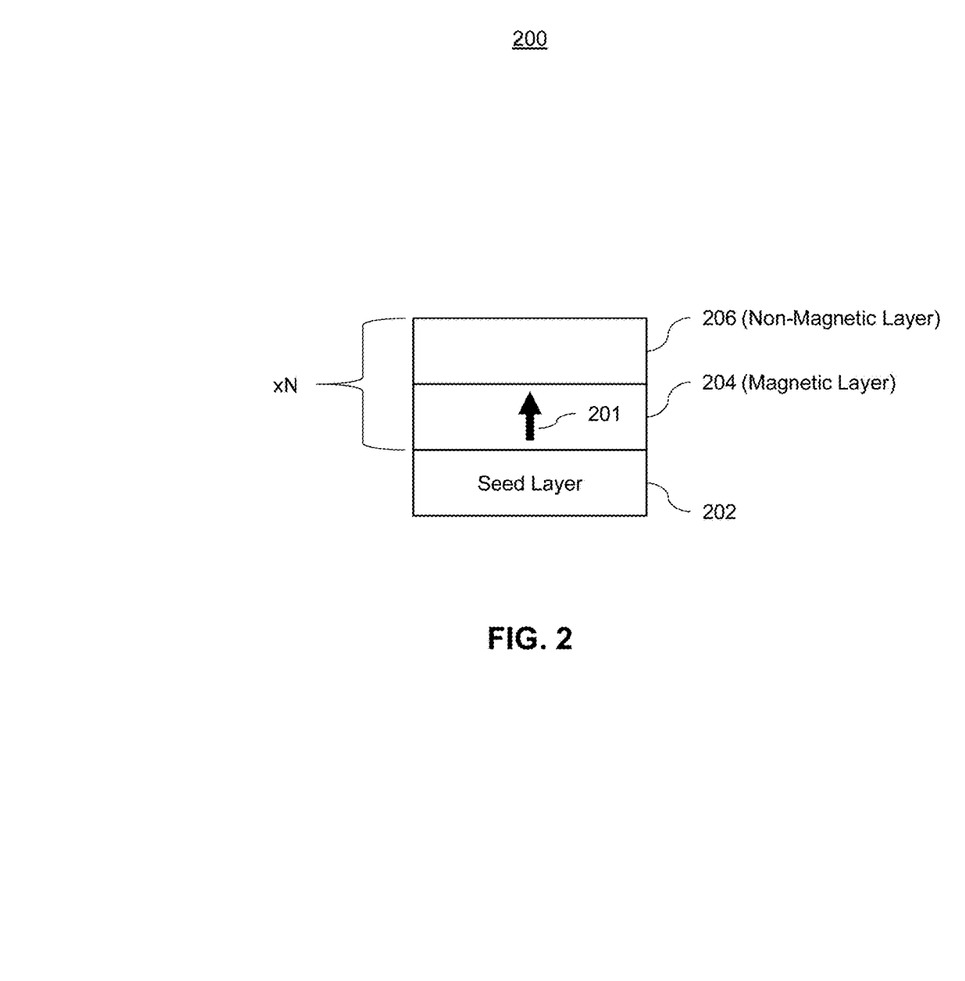
FIG. 2 depicts a multilayer structure that may be used as a reference layer in the FIG. 1 perpendicular magnetic tunnel junction stack, according to an embodiment of the present invention.
Figure 3:
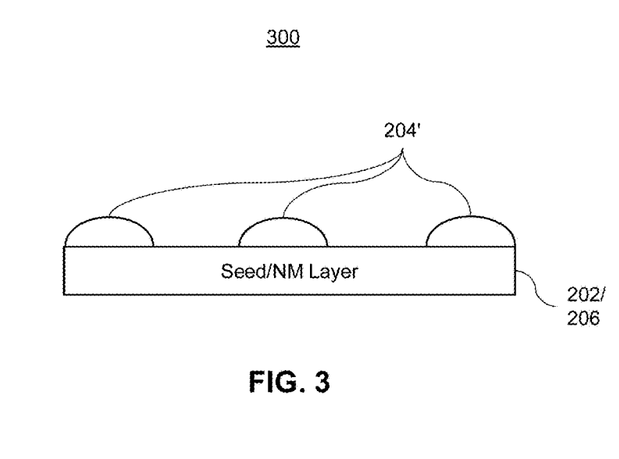
FIG. 3 depicts initial growth of a magnetic layer in the multilayer structure of FIG. 2, according to an embodiment of the present invention.
Figure 4:
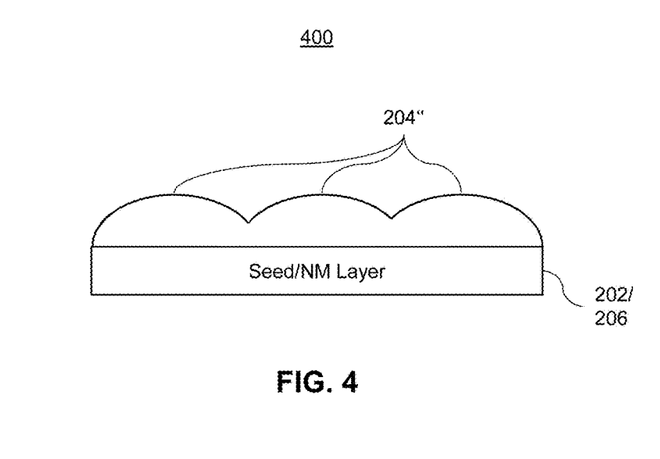
FIG. 4 depicts continued growth of the magnetic layer in the multilayer structure of FIG. 2, according to an embodiment of the present invention.

FIG. 2 shows a side cross-sectional view 200 of a [Co|NM]$_{xN}$ multilayer formed over a seed layer 202. The seed layer 202 may be formed of similar materials and with similar sizing as that described above with respect to seed layer 102. The [Co|NM]$_{xN}$ multilayer formed over the seed layer 202 includes a magnetic layer 204 and a NM layer 206. The magnetic layer 204 and NM layer 206 may be repeated in a multilayer structure, as denoted in FIG. 2 by the "xN" indicating that these layers may be repeated N times, where N is an integer of one or greater. Similar notation is used in various figures discussed below, to denote that a multilayer structure may be repeated as desired (e.g., N times).

The magnetic layer 204 may comprise Co as discussed above, although other suitable magnetic materials such as Co-rich Co—Fe alloy, Co-rich Co—Ni alloy, CoB alloy, etc. may be used. The magnetic layer 204 may have a vertical thickness in the range of 2 Å to 20 Å. It is to be appreciated that each of the magnetic layers 204 in the [Co|NM]$_{xN}$ multilayer need not necessarily be of the same thickness. In some embodiments, each magnetic layer 204 in the [Co|NM]$_{xN}$ multilayer may have an individually tuned thickness to optimize the dipolar stray field created by the reference layer on the free layer of the MTJ stack.

The NM layer 206 may be formed of Ir, Rh or another suitable material such as an alloy of Ir, Rh with each other and also possibly with additional alloying of one or more other materials. The NM layer 206 may have a vertical thickness in the range of 3 Å to 15 Å.

In the [Co|NM]$_{xN}$ multilayer, the magnetic layer 204 includes a magnetic coupling 201 as illustrated. The multiplier "N" for the FIG. 2 [Co|NM]$_{xN}$ multilayer may range from 1-10, although more than 10 instances of the [Co|NM] multilayer may be used if desired.

As described above, growth of the magnetic layer 204 (e.g., Co) over the seed layer 202 or NM layer 206 may result in the formation of three-dimensional "islands" of the magnetic material. This is illustrated in the side cross-sectional view 300 of FIG. 3, which shows initial growth of the islands 204' of magnetic material over the seed layer 202 or NM layer 206. As growth of the magnetic layer 204 continues, the islands will start merging as illustrated in the side cross-sectional view 400 of FIG. 4, which shows continued growth resulting in merged islands 204" of magnetic material over the seed layer 202 or NM layer 206.

Figure 5:
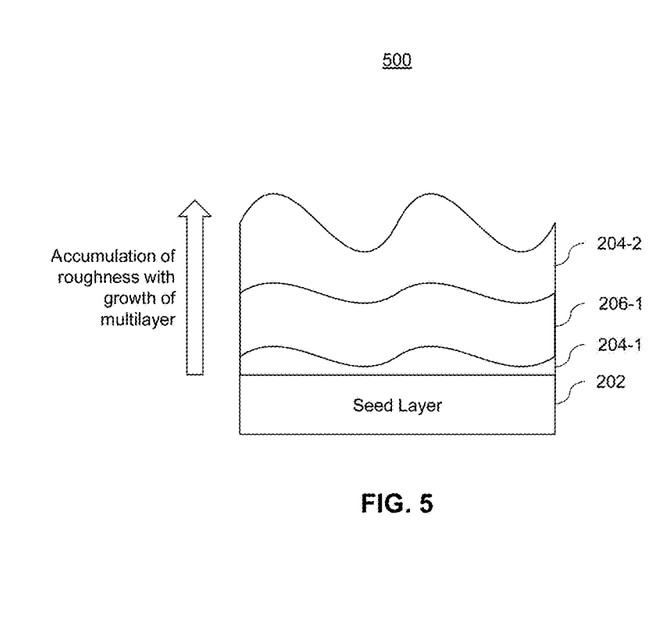
FIG. 5 depicts accumulated roughness resulting from growth of magnetic layers in the multilayer structure of FIG. 2, according to an embodiment of the present invention.

If growth were to continue, the magnetic material would eventually smooth, but it is generally desired to have the [Co|NM]$_{xN}$ multilayer be as thin as possible. Thus, the [Co|NM]$_{xN}$ multilayer may exhibit accumulated roughness resulting from the non-continuous magnetic layers formed therein. The side cross-sectional view 500 of FIG. 5 illustrates such accumulated roughness resulting from growth of the [Co|NM]$_{xN}$ multilayer over seed layer 202, including magnetic layer 204-1, NM layer 206-1, magnetic layer 204-2, etc.

Figure 6:
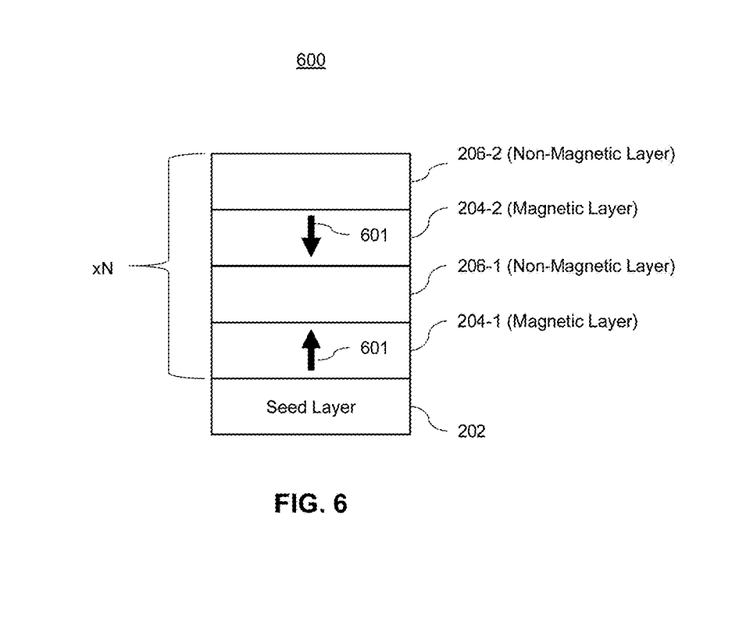
FIG. 6 depicts the FIG. 2 multilayer structure with antiparallel coupling of the magnetic layers, according to an embodiment of the present invention.

FIG. 6 shows a side cross sectional view of the [Co|NM]$_{xN}$ multilayer, where N=2. As shown, there is antiparallel coupling 601 when the NM layer 206-1 thickness is in the range of 3 Å to 7 Å.

Embodiments provide techniques for optimizing an interface between the NM and magnetic layers in the multilayer stack of reference layer 104. In some embodiments, which will be described in further detail below with respect to FIGS. 7-12, the interface between the NM and magnetic layer is dusted with one or several elements such as platinum (Pt), ruthenium (Ru), palladium (Pd), gold (Au) or nickel (Ni). In other embodiments, which will be described in further detail below with respect to FIGS. 13-16, the NM is alloyed or partially alloyed with one or several elements such as Pt, Ru, Pd, Au or Ni. The dusting or alloying of the NM layer changes the interface energies between the NM layer and a magnetic layer (e.g., a Co layer), therefore enabling a two-dimensional (2D) growth mode. In other words, the interface energies are changed to permit a layer by layer growth mode, which provides various advantages. Growth of continuous and homogeneous magnetic layers (e.g., Co layers) enhances the reliability of the reference layer 104, especially for small pMTJ devices. The crystalline grains of sputtered MTJ films are typically in the range of 2-15 nm. A "small" pMTJ device may thus refer to less than 10-15 grain size diameter, so that single weak grains might start falling into account for the stability of a device. In addition, the layer by layer growth mode strongly reduces roughness of the reference layer 104 compared to cases without dusting or alloying of the NM layers with Pt, Ru, Pd, Au or Ni. The multilayer used as the reference layer 104 may be grown from physical vapor deposition (PVD) of layers using elemental or alloy targets. Multilayer deposition, and multilayer deposition in combination with co-deposition, can be applied.

Figure 7:
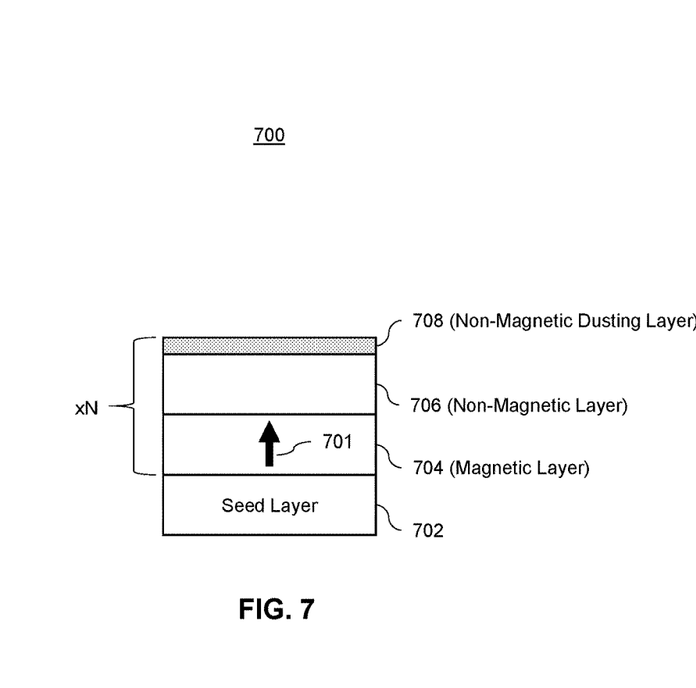
FIG. 7 depicts a multilayer structure that may be used as a reference layer in the FIG. 1 perpendicular magnetic tunnel junction stack which includes a dusting layer, according to an embodiment of the present invention.

FIG. 7 shows a side cross-sectional view 700 of a [Co|NM|DL]$_{xN}$ multilayer. The [Co|NM|DL]$_{xN}$ multilayer is formed over a seed layer 702. The [Co|NM|DL]$_{xN}$ multilayer includes a magnetic layer 704, a NM layer 706 formed over the magnetic layer 704, and a non-magnetic dusting layer (DL) 708 formed over the NM layer 706. The seed layer 702 may be formed with similar sizing and similar materials as that of the seed layer 102 or 202. In some embodiments, the seed layer 702 is formed of a same material as the DL 708. The magnetic layer 704 may be formed with similar sizing and similar materials as the magnetic layer 204 (e.g., Co or another suitable material). The NM layer 706 may be formed of with similar sizing and similar materials as the NM layer 206 (e.g., Ir, Rh, etc.). FIG. 7 further shows the magnetic coupling 701 of magnetic layer 704.

The DL 708 may be formed of Pt, Ru, Pd, Au, Ni or another suitable material. In some embodiments, Pt is a preferred material due to its perpendicular anisotropy with magnetics out-of-plane (e.g., because of the very strong interface perpendicular magnetic anisotropy between Pt and Co or Co-based alloys). The DL 708 may have a vertical thickness in the range of 0.4 Å to 4 Å.

Figure 8:
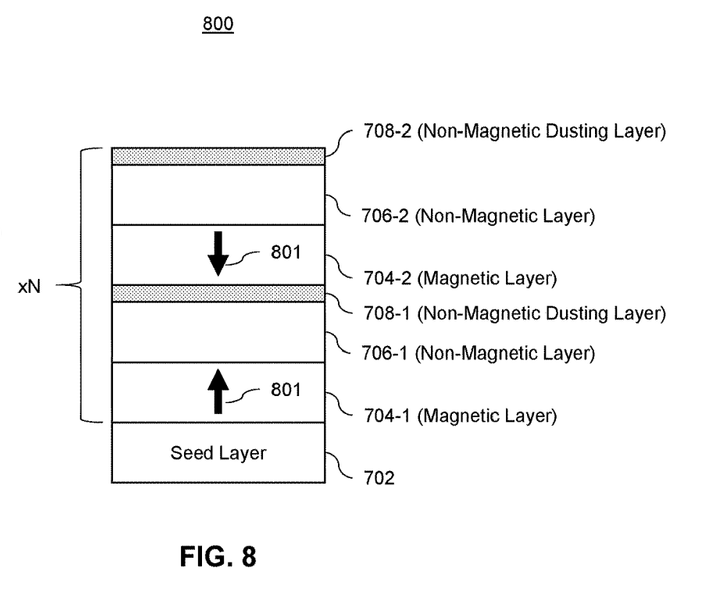
FIG. 8 depicts the FIG. 7 multilayer structure with antiparallel coupling of magnetic layers, according to an embodiment of the present invention.

FIG. 8 shows a side cross-sectional view 800 of the FIG. 7 [Co|NM|DL]$_{xN}$ multilayer, where N=2 such that there are multiple magnetic layers 704-1, 704-2, multiple NM layers 706-1, 706-2 and multiple DLs 708-1, 708-2 as illustrated. In the FIG. 8 [Co|NM|DL]$_{xN}$ multilayer, there is antiparallel magnetic coupling 801 between the magnetic layers 704-1 and 704-2.

Figure 9:
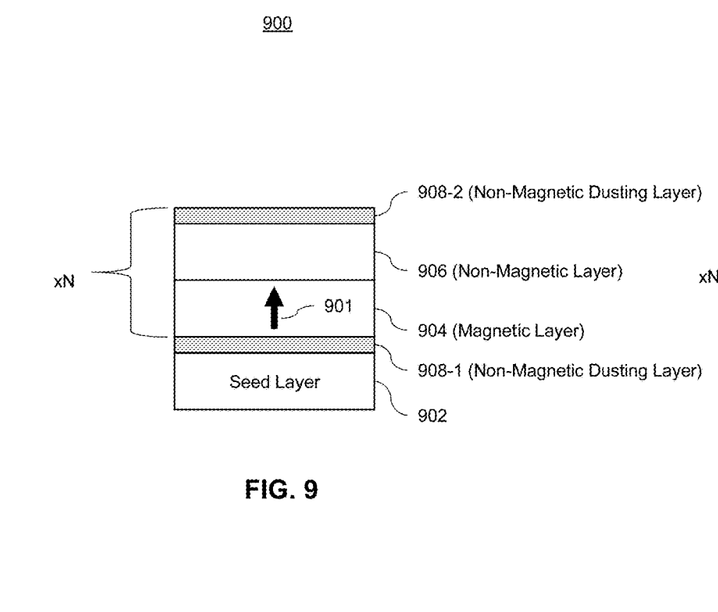
FIG. 9 depicts a multilayer structure that may be used as a reference layer in the FIG. 1 perpendicular magnetic tunnel junction stack which includes a dusting layer formed over a seed layer, according to an embodiment of the present invention.

FIG. 9 shows a side cross-sectional view 900 of an alternate [Co|NM|DL]$_{xN}$ multilayer arrangement, with a DL 908-1 disposed between the seed layer 902 and magnetic layer 904. Advantageously, the DL 908-1 can help the initial growth of magnetic layer 904 to be smooth, rather than just the magnetic layers in the [Co|NM|DL]$_{xN}$ multilayer which are formed over the NM layer 906. A second DL 908-2 is formed over the NM layer 906 as shown, in a manner similar to that described above with respect to FIG. 7. The materials and sizing of the seed layer 902, magnetic layer 904, NM layer 906 and DLs 908-1 and 908-2 may be similar to that of the seed layer 702, magnetic layer 704, NM layer 706 and DL 708, respectively. FIG. 9 also shows the magnetic coupling 901 of magnetic layer 904.

Figure 10:
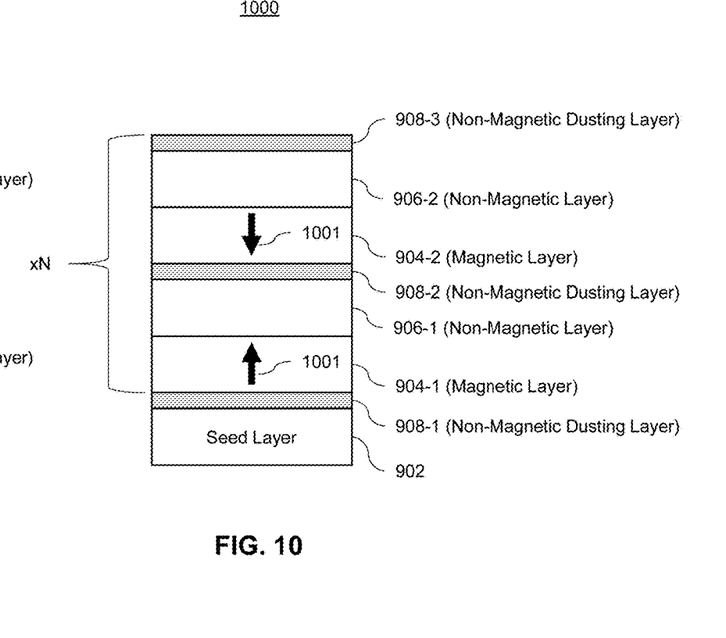
FIG. 10 depicts the FIG. 9 multilayer structure with antiparallel coupling of magnetic layers, according to an embodiment of the present invention.

FIG. 10 shows a side cross-sectional view 1000 of the alternate [Co|NM|DL]$_{xN}$ multilayer of FIG. 9, where N=2 such that there are multiple magnetic layers 904-1, 904-2, multiple NM layers 906-1, 906-2, and multiple DL 908-2, 908-3 as illustrated. In the FIG. 10 alternate [Co|NM|DL]$_{xN}$ multilayer, there is antiparallel magnetic coupling 1001 between the magnetic layers 904-1 and 904-2.

Figure 11:
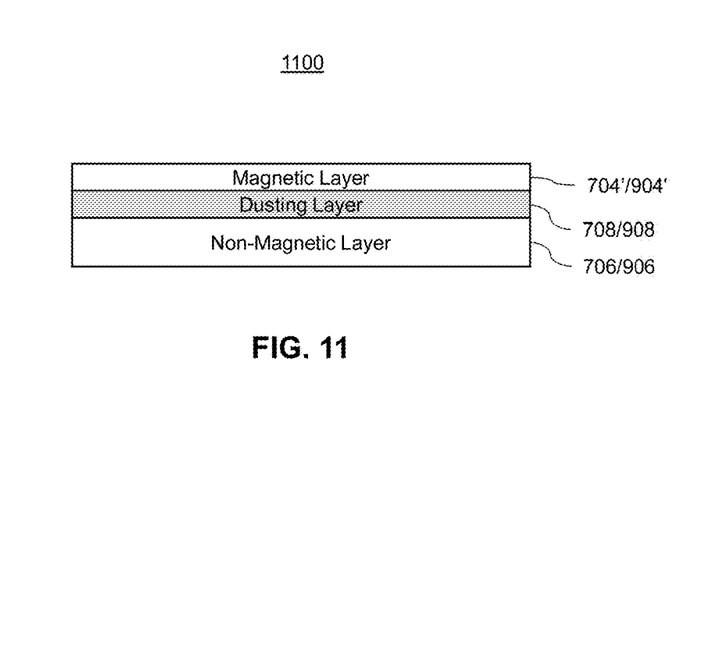
FIG. 11 depicts growth of a magnetic layer in the FIG. 7 and FIG. 9 multilayer structures, according to an embodiment of the present invention.
Figure 12:
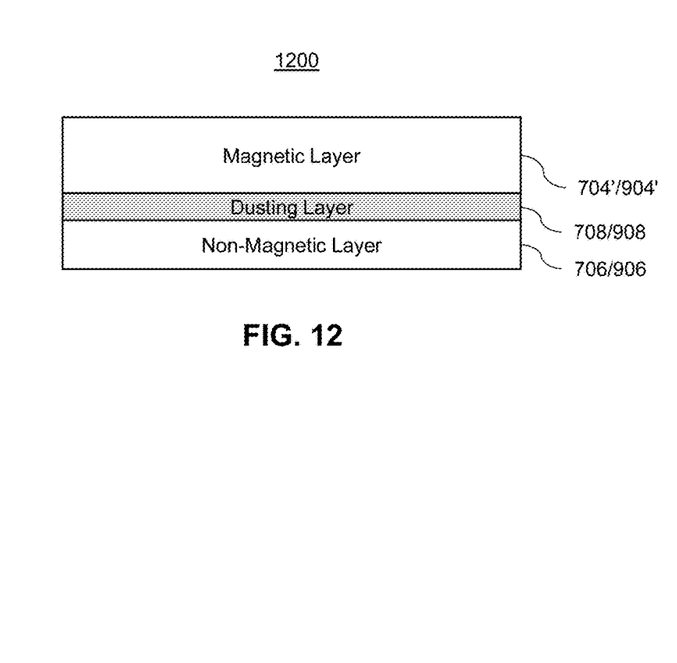
FIG. 12 depicts continued growth of the magnetic layer in the FIG. 7 and FIG. 9 multilayer structures, according to an embodiment of the present invention.

FIGS. 11 and 12 show side cross-sectional views 1100 and 1200, respectively, illustrating the 2D layer by layer growth of magnetic layers 704/904 over a DL 708/908 formed on a NM layer 706/906 in the FIG. 7 and FIG. 9 [Co|NM|DL]$_{xN}$ multilayers. As shown in FIG. 11, the growth of the magnetic layer 704'/904' over the DL 708/908 starts smooth, as compared to the formation of the magnetic "islands" as in the FIG. 2 multilayer structure described above. FIG. 12 shows continued growth of the magnetic layer 704"/904" over the DL 708/908, illustrating that there is no or minimal roughness accumulation.

Figure 13:
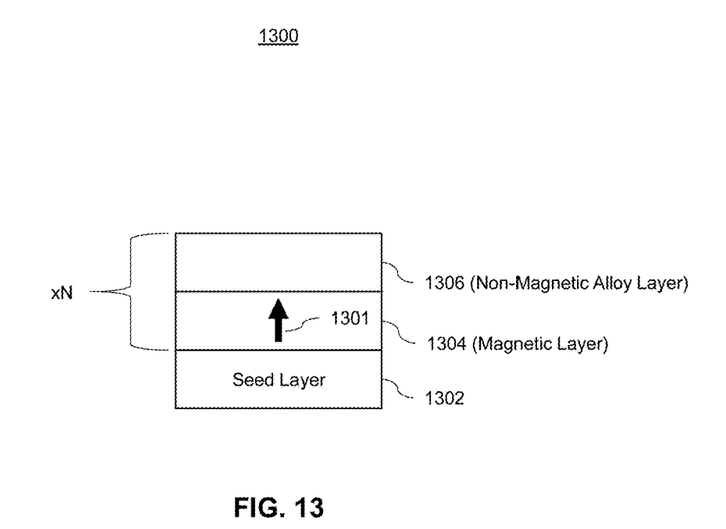
FIG. 13 depicts a multilayer structure that may be used as a reference layer in the FIG. 1 perpendicular magnetic tunnel junction stack which includes a non-magnetic alloy layer, according to an embodiment of the present invention.

FIG. 13 shows a side cross-sectional view 1300 of a [Co|NMA]$_{xN}$ multilayer. The [Co|NMA]$_{xN}$ multilayer is formed over a seed layer 1302, and includes a magnetic layer 1304 formed over the seed layer 1302 and a non-magnetic alloy (NMA) layer 1306 formed over the magnetic layer 1304. The seed layer 1302 and magnetic layer 1304 may be formed of similar materials and with similar sizing as the seed layer 702 and magnetic layer 704. In some embodiments, the seed layer 1302 is formed of a material similar to that as the NMA layer 1306 described below. FIG. 13 also shows the magnetic coupling 1301 of the magnetic layer 1304.

The NM layer in the multilayer stack for reference layer 104 need not be a "pure" non-magnetic material. Thus, rather than forming a dusting layer as described above with respect to FIGS. 7-12, the NM layer may be replaced with a NMA layer 1306, where the NMA layer 1306 is an alloy of a NM material and a DL material, such as NM$_X$DL$_Y$, where X is greater than 50%. The NM material in the NMA layer 1306 may be Ir, Rh or another suitable non-magnetic material. The DL material in the NMA layer 1306 may be Pt, Ru, Pd, Au, Ni or another suitable material. The NMA layer 1306 may have a vertical thickness in the range of 3 Å to 15 Å.

Figure 14:
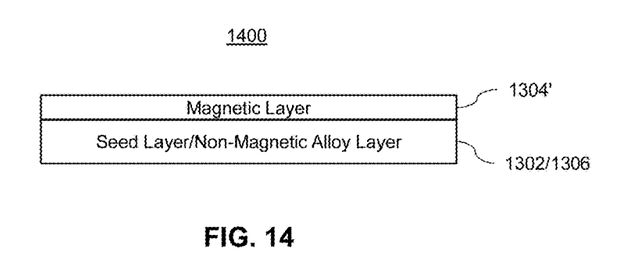
FIG. 14 depicts growth of a magnetic layer in the FIG. 13 multilayer structure, according to an embodiment of the present invention.
Figure 15:
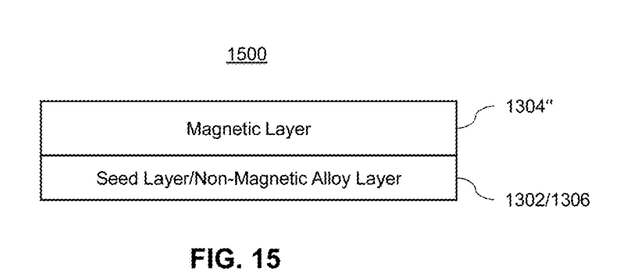
FIG. 15 depicts continued growth of the magnetic layer in the FIG. 13 multilayer structure, according to an embodiment of the present invention.

FIGS. 14 and 15 show side cross-sectional views 1400 and 1500, respectively, illustrating the 2D layer-by-layer growth of a magnetic layer over NMA layer 1306 in the FIG. 13 [Co|NMA]$_{xN}$ multilayer. As shown in FIG. 14, the growth of the magnetic layer 1304' over the NMA layer 1306 starts smooth, as compared to the formation of the magnetic "islands" as in the FIG. 2 multilayer structure described above. FIG. 15 shows continued growth of the magnetic layer 1304" over the NMA layer 1306, illustrating that there is no or minimal roughness accumulation.

Figure 16:
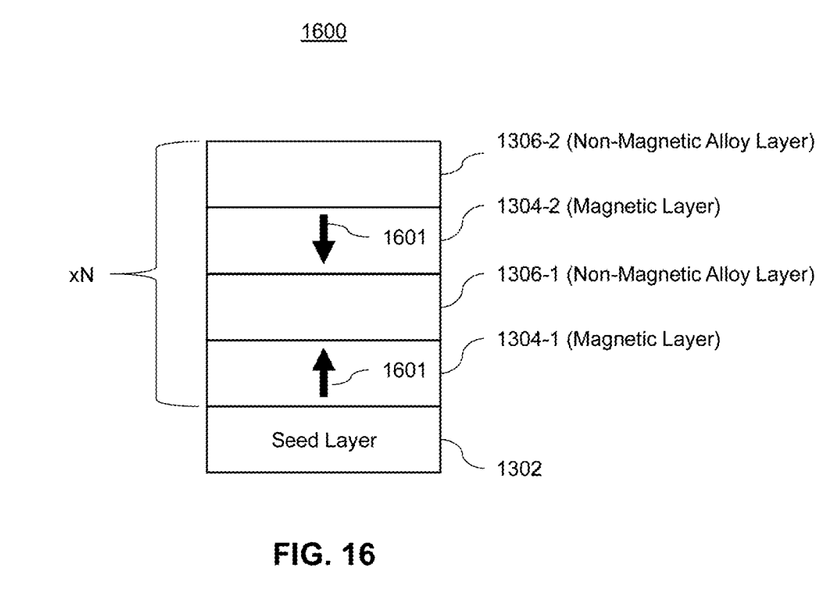
FIG. 16 depicts FIG. 13 multilayer structure with antiparallel coupling of magnetic layers, according to an embodiment of the present invention.

FIG. 16 shows a side cross-sectional view 1600 of the [Co|NMA]$_{xN}$ multilayer of FIG. 13, where N=2 such that there are multiple magnetic layers 1304-1, 1304-2 and multiple NMA layers 1306-1, 1306-2 as illustrated. In the FIG. 16 [Co|NMA]$_{xN}$ multilayer, there is antiparallel magnetic coupling 1601 between the magnetic layers 1304-1 and 1304-2.

In some embodiments, a method of forming a semiconductor structure comprises forming a multilayer stack of one or more multilayers disposed over a seed layer, each of the one or more multilayers comprising a magnetic layer and an additional layer disposed over a top surface of the magnetic layer. The additional layer comprises a non-magnetic material and a dusting material. The multilayer stack provides a reference layer of a perpendicular magnetic tunnel junction stack. In some embodiments, the multilayer stack comprises two or more of the multilayers.

In some embodiments, the magnetic layer is formed of Co, the non-magnetic material comprises at least one of Ir and Rh, and the dusting material comprises at least one of Pt, Ru, Pd, Au and Ni.

In some embodiments, the additional layer comprises a non-magnetic layer formed of the non-magnetic material disposed over the top surface of the magnetic layer and a dusting layer formed of the dusting material disposed over a top surface of the non-magnetic layer. In some embodiments, the seed layer may be formed of the non-magnetic material, and the method may further comprise forming an additional dusting layer formed of the dusting material disposed between the seed layer and the magnetic layer of a bottommost multilayer in the multilayer stack. In other embodiments, the seed layer is formed of the dusting material.

In some embodiments, the additional layer comprises a non-magnetic alloy layer formed of the non-magnetic material and the dusting material. The non-magnetic material may form at least 50% of the non-magnetic alloy layer.

In some embodiments, a semiconductor structure comprises a seed layer and a multilayer stack of one or more multilayers disposed over the seed layer, each of the one or more multilayers comprising a magnetic layer and an additional layer disposed over a top surface of the magnetic layer. The additional layer comprises a non-magnetic material and a dusting material. The multilayer stack provides a reference layer of a perpendicular magnetic tunnel junction stack.

In some embodiments, an integrated circuit comprises a semiconductor structure comprising a seed layer and a multilayer stack of one or more multilayers disposed over the seed layer, each of the one or more multilayers comprising a magnetic layer and an additional layer disposed over a top surface of the magnetic layer. The additional layer comprises a non-magnetic material and a dusting material. The multilayer stack provides a reference layer of a perpendicular magnetic tunnel junction stack.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming a multilayer stack of two or more multilayers disposed over a seed layer, each of the two or more multilayers comprising:
        a magnetic layer; and
        an additional layer disposed over a top surface of the magnetic layer;
    wherein the additional layer is non-magnetic, the additional layer comprising a first non-magnetic material and a dusting material comprising a second non-magnetic material different than the first non-magnetic material; and
    wherein the multilayer stack provides a reference layer of a perpendicular magnetic tunnel junction stack.

2. The method of claim 1, wherein the magnetic layer is formed of cobalt (Co).

3. The method of claim 1, wherein the first non-magnetic material comprises at least one of iridium (Ir) and rhodium (Rh).

4. The method of claim 3, wherein the dusting material comprises platinum (Pt).

5. The method of claim 3, wherein the dusting material comprises at least one of platinum (Pt), ruthenium (Ru), palladium (Pd), gold (Au) and nickel (Ni).

6. The method of claim 1, wherein the additional layer comprises:

a non-magnetic layer formed of the first non-magnetic material disposed over the top surface of the magnetic layer; and a dusting layer formed of the dusting material disposed over a top surface of the non-magnetic layer.

7. The method of claim 6, wherein the seed layer is formed of the first non-magnetic material.

8. The method of claim 7, further comprising forming an additional dusting layer formed of the dusting material disposed between the seed layer and the magnetic layer of a bottommost multilayer in the multilayer stack.

9. The method of claim 1, wherein the seed layer is formed of the dusting material.

10. The method of claim 1, wherein the additional layer comprises a non-magnetic alloy layer formed of the first non-magnetic material and the dusting material.

11. The method of claim 10, wherein the first non-magnetic material forms at least 50% of the non-magnetic alloy layer.

12. A semiconductor structure, comprising:
a seed layer; and
a multilayer stack of two or more multilayers disposed over the seed layer, each of the two or more multilayers comprising:
a magnetic layer; and
an additional layer disposed over a top surface of the magnetic layer;
wherein the additional layer is non-magnetic, the additional layer comprising a first non-magnetic material and a dusting material comprising a second non-magnetic material different than the first non-magnetic material; and
wherein the multilayer stack provides a reference layer of a perpendicular magnetic tunnel junction stack.

13. The semiconductor structure of claim 12, wherein:
the magnetic layer is formed of cobalt (Co);
the first non-magnetic material comprises at least one of iridium (Ir) and rhodium (Rh); and
the dusting material comprises at least one of platinum (Pt), ruthenium (Ru), palladium (Pd), gold (Au) and nickel (Ni).

14. The semiconductor structure of claim 12, wherein the additional layer comprises:
a non-magnetic layer formed of the first non-magnetic material disposed over the top surface of the magnetic layer; and
a dusting layer formed of the dusting material disposed over a top surface of the non-magnetic layer.

15. The semiconductor structure of claim 12, wherein the seed layer is formed of the first non-magnetic material and further comprising an additional dusting layer formed of the dusting material disposed between the seed layer and the magnetic layer of a bottommost multilayer in the multilayer stack.

16. The semiconductor structure of claim 12, wherein the seed layer is formed of the dusting material.

17. The semiconductor structure of claim 12, wherein the additional layer comprises a non-magnetic alloy layer formed of the first non-magnetic material and the dusting material.

18. The semiconductor structure of claim 17, wherein the first non-magnetic material forms at least 50% of the non-magnetic alloy layer.

19. An integrated circuit comprising:
a semiconductor structure comprising:
a seed layer; and
a multilayer stack of two or more multilayers disposed over the seed layer, each of the two or more multilayers comprising:
a magnetic layer; and
an additional layer disposed over a top surface of the magnetic layer;
wherein the additional layer is non-magnetic, the additional layer comprising a first non-magnetic material and a dusting material comprising a second non-magnetic material different than the first non-magnetic material; and
wherein the multilayer stack provides a reference layer of a perpendicular magnetic tunnel junction stack.

20. The integrated circuit of claim 19, wherein the additional layer comprises a non-magnetic alloy layer formed of the first non-magnetic material and the dusting material.

* * * * *